United States Patent
Hashimoto

(10) Patent No.: US 7,227,421 B2
(45) Date of Patent: Jun. 5, 2007

(54) CRYSTAL OSCILLATOR CIRCUIT

(75) Inventor: Hideo Hashimoto, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 225 days.

(21) Appl. No.: 10/940,170

(22) Filed: Sep. 14, 2004

(65) Prior Publication Data

US 2005/0083140 A1   Apr. 21, 2005

(30) Foreign Application Priority Data

| Sep. 17, 2003 | (JP) | ............................. 2003-324580 |
| Oct. 9, 2003 | (JP) | ............................. 2003-351203 |
| Aug. 23, 2004 | (JP) | ............................. 2004-242607 |

(51) Int. Cl.
*H03B 5/32* (2006.01)
(52) U.S. Cl. .............. 331/158; 331/116 R; 331/116 FE
(58) Field of Classification Search ................ 331/158, 331/116 R, 74, 116 FE
See application file for complete search history.

(56) References Cited

U.S. PATENT DOCUMENTS 4,479,259 A * 10/1984 Fenk .......................... 455/318

* cited by examiner

*Primary Examiner*—Arnold Kinkead
(74) *Attorney, Agent, or Firm*—Scott D. Wofsy; Edwards Angell Palmer & Dodge LLP

(57) ABSTRACT

An object of the invention is to provide an oscillator circuit employing an ECL to prevent variation in oscillation frequency and oscillation gain, and to simplify design. The construction is such that in a crystal oscillator circuit comprising: a resonance circuit consisting of a crystal element as an inductor component and a dividing capacitor, an oscillation amplifier comprising an ECL driven by a power supply voltage connected to the resonance circuit, and a pull-down resistor between an output terminal of the ECL and ground, there is provided an AC impedance amplifier circuit connected in series to the pull-down resistor.

5 Claims, 4 Drawing Sheets

CRYSTAL OSCILLATOR CIRCUIT

BACKGROUND OF THE INVENTION

The present invention relates to a high-frequency (for example, 600 MHz) crystal oscillator circuit, and in particular to a crystal oscillator circuit wherein design is simplified and changes in frequency are prevented.

Since the frequency of a crystal oscillator circuit is very stable, it is employed as a frequency source in a variety of electronic equipment. Recently, crystal oscillator circuits having a high oscillation frequency are in demand due to the need for development of optical communications systems. One of these crystal oscillator circuits is the high-speed ECL (Emitter Coupling Logic) employed as an oscillation amplifier.

FIG. 6 through FIG. 8 explain a conventional example of a crystal oscillator circuit. FIG. 6 shows the crystal oscillator circuit, FIG. 7 the internal circuit of the ECL, and FIG. 8 a simplified crystal oscillator circuit.

As shown in FIG. 6, the crystal oscillator circuit comprises a resonance circuit 1 shown within the dotted line and an oscillation amplifier 2. The resonance circuit 1 comprises a crystal element 3 and dividing capacitors 4a and 4b. The crystal element 3 is of the AT cut type, and functions as an inductor component. The dividing capacitors 4a and 4b are connected at either end of the crystal element 3, forming the input and output side of the oscillation amplifier 2, with each being connected to ground.

As explained above, the oscillation amplifier 2 comprises the ECL which integrates a differential amplifier, with two inputs ($A_i$, $B_i$), and two outputs ($C_o$, $D_o$) having opposite phases. For example, as shown in the interior of the ECL within the dashed line in FIG. 7, the emitters of first and second transistors TR1 and TR2 are connected to a common ground. Moreover, these have input ends ($A_i$, $B_i$) which apply opposite phase signals to each base, with each collector at a power supply Vcc.

Furthermore, as shown in FIG. 7, third and fourth transistors TR3 and TR4 are connected to the first and second transistors TR1 and TR2, and have output terminals ($C_o$, $D_o$) which obtain opposite phase signals from the emitters. Normally, pull-down resistors 9a and 9b for controlling emitter current are connected to each output terminal ($C_o$, $D_o$) as external loads. Normally, the pull-down resistors 9a and 9b have large resistance values in a range of, for example 150 to 200Ω, to prevent heating due to excessive direct current and to stabilize operation.

In this ECL, regarding the input terminals ($A_i$, $B_i$), a base voltage Vbb is applied as a bias voltage from the input terminal $A_i$ to the input terminal $B_i$ via a high-frequency blocking resistor 7 as shown in FIG. 6 and FIG. 8. Moreover the input terminals are connected to ground via a bypass capacitor 8. The base voltage is generated from the power supply Vcc by a circuit not shown in the drawings. However a bypass capacitor is unnecessary when driven with two power supplies.

Both ends of the crystal element 3, as shown in FIG. 6, are connected between the mutually opposite phase input and output (between $B_i$ and $C_o$) of the ECL employed as the oscillator. A buffer amplifier 5 employing a similar ECL to that for oscillation, is connected to the next stage of the oscillation amplifier. FIG. 8 shows the system simplified to include only the oscillator, with the pull-down resistor 9a between one input-output pair ($B_i$, $C_o$), affecting the oscillator system.

In such a crystal oscillator circuit, the oscillation amplifier (ECL) 2 feedback amplifies the resonant frequency of the resonance circuit 1 connected between one input-output pair ($B_i$, $C_o$) and maintains a square wave oscillation. The use of differential amplification allows input-output of a phase opposite to one input-output pair ($B_i$, $C_o$) to be obtained at the other input-output pair ($A_i$, $D_o$). Two outputs of the opposite phase, with the pull-down resistor 9a, 9b as load, are amplified by the buffer amplifier 5 (ECL) and a binary oscillation is output. The oscillation frequency almost matches the resonant frequency, and is determined precisely by the capacity of the load on the side of the circuit as seen from the crystal element 3.

However, in the conventional crystal oscillator circuit (see FIG. 6) of the aforementioned configuration, the effective capacity of the dividing resistor 4b changes due to the pull-down resistor 9a, resulting in difficulties in design. That is to say, since the pull-down resistor 9a is connected in parallel with the dividing capacitor 4b, the effective capacity of the dividing capacitor 4b becomes that of an equivalent series capacitance with the pull-down resistor 9a. Therefore the resonant frequency of the resonance circuit 1 is affected by the pull-down resistor 9a, resulting in difficulties in design. As a result, for example fluctuations occur in the oscillation frequency and oscillation gain.

Moreover, the equivalent series resistance with the pull-down resistor 9a becomes a load on the resonance circuit, and the sharpness of the resonance peak, that is to say, the Q value, is reduced, and for example, phase noise characteristics deteriorate. Furthermore, the equivalent series capacitance is less than that of the dividing capacitor 4b. Therefore, if for example, the dividing capacitor 4b of the output side comprises a voltage-controlled oscillator as a variable capacity diode, there is also a problem in that the range of variation of the oscillation frequency is reduced.

Furthermore, since the high-frequency blocking resistor 7 is connected in parallel with the input dividing capacitor 4a, the effective capacity of the dividing resistor 4b changes, therein resulting in difficulties in design as aforementioned. However, since the high-frequency blocking resistor 7 has a high resistance value, its effect is less than that of the pull-down resistor 9a of the output side. Even so, this problem cannot be ignored.

SUMMARY OF THE INVENTION

An object of the present invention is to provide an oscillator circuit employing an ECL to prevent variation in oscillation frequency and oscillation gain, and to simplify design.

The first invention of the present invention is such that in a crystal oscillator circuit comprising: a resonance circuit consisting of a crystal element as an inductor component and a dividing capacitor, an oscillation amplifier comprising an ECL driven by a power supply voltage connected to the resonance circuit, and a pull-down resistor between an output terminal of the ECL and ground, there is provided an AC impedance amplifier circuit connected in series to the pull-down resistor.

Moreover, as an embodiment of the first invention, the AC impedance amplifier circuit is a parallel resonance circuit, and the resonant frequency of the parallel resonance circuit is the same frequency as the oscillation frequency, and similarly, the AC impedance amplifier circuit is an inductor.

In a crystal oscillator circuit of the second invention comprising: a resonance circuit consisting of a crystal element as an inductor component and a dividing capacitor, an oscillation amplifier comprising an ECL driven by a power supply voltage connected to the resonance circuit, and a high-frequency blocking resistor between an input terminal of the ECL and ground, there is provided an AC impedance amplifier circuit in the high-frequency blocking resistor.

Furthermore, as an embodiment of the second invention, the AC impedance amplifier circuit is a parallel resonance circuit connected in series to the high-frequency blocking resistor, and a resonant frequency of the resonance circuit is the same frequency as the oscillation frequency. Moreover, similarly, in the AC impedance amplifier circuit, the high-frequency blocking resistor is replaced by a parallel resonance circuit, and a resonant frequency of the parallel resonance circuit is the same frequency as the oscillation frequency, and in the AC impedance amplifier circuit, the high-frequency blocking resistor is replaced by an inductor.

In a crystal oscillator circuit of the third invention comprising: a resonance circuit consisting of a crystal element as an inductor component and a dividing capacitor, an oscillation amplifier comprising an ECL driven by a power supply voltage connected to the resonance circuit, a pull-down resistor between an input terminal of the ECL and ground, and a high-frequency blocking resistor between an input terminal of the ECL and ground, there is provided an AC impedance amplifier circuit connected in series to the pull-down resistor, and there is provided an AC impedance amplifier circuit in the high-frequency blocking resistor.

According to the first invention, the resonance circuit comprising the crystal element and the dividing capacitor reduces the effect from the series circuit of the pull-down resistor and the AC impedance amplifier circuit, by the AC impedance amplifier circuit connected to the pull-down resistor. That is to say, the equivalent series capacitance of the series circuit of the dividing capacitor on the output side of the resonance circuit, the pull-down resistor, and the AC impedance amplifier circuit, approaches that of the dividing capacitor.

Consequently, in the first invention, the resonance circuit becomes an independent circuit wherein the pull-down resistor is ignored, facilitating design in terms of determining the oscillation frequency. Moreover, for example, when the dividing capacitor on the output side is employed as a variable capacitance diode to constitute a voltage-controlled oscillator, a large range of variation in the oscillation frequency can be maintained. Moreover, since the equivalent series resistance as the load on the resonance circuit is also then reduced, the Q value is maintained at a high value, and for example, phase noise characteristics are improved.

Furthermore, in an embodiment of the first invention the AC impedance amplifier circuit is a parallel resonance circuit having the oscillation frequency as the resonance frequency. Consequently, when the parallel resonance circuit resonates, the AC impedance becomes substantially infinite, and the dividing capacitors on the output side are almost unaffected electrically. Therefore it is ideal as an AC impedance amplifier circuit. Since DC impedance is fundamentally zero, DC current in the pull-down resistor is unrestricted.

In an embodiment of the first invention, the AC impedance amplifier circuit is an inductor. Consequently the AC impedance is raised and the DC resistance is zero. Therefore, the effect on the dividing capacitor on the output side is reduced, and an effect similar to the aforementioned occurs, and the effect on the pull-down resistor is also small. The number of components can thus be reduced.

Moreover, according to the second invention, the resonance circuit comprising the crystal element and the dividing capacitor reduces the effect from the series circuit of the high-frequency blocking resistor and the AC impedance amplifier circuit, by the AC impedance amplifier circuit provided in the high-frequency blocking resistor. That is to say, the equivalent series capacitance of the series circuit of the dividing capacitor on the input side of the resonance circuit, the pull-down resistor, and the AC impedance amplifier circuit, approaches that of the dividing capacitor.

Consequently, in the second invention, the resonance circuit becomes an independent circuit wherein the high-frequency blocking resistor is ignored, facilitating design in terms of determining the oscillation frequency. For example, when the dividing capacitor on the input side is employed as a variable capacitance diode to constitute a voltage-controlled oscillator, a large range of variation in the oscillation frequency can be maintained. Moreover, since the equivalent series resistance as the load on the resonance circuit is also then reduced, the Q value is maintained at a high value, and for example, phase noise characteristics are improved.

Furthermore, according to an embodiment of the second invention, since the AC impedance amplifier circuit is similarly a parallel resonance circuit, AC impedance becomes substantially infinite and is ideal. Moreover, since the AC impedance amplifier circuit in claim 7 is an inductor, the number of components can be reduced compared to the parallel resonance circuit.

In the third invention, since an AC impedance amplifier circuit is provided in the pull-down resistor and the high-frequency blocking resistor, the resonance circuit comprising the crystal element and the dividing capacitors become electrically independent. Consequently the effect of the pull-down resistor and the high-frequency blocking resistor is reduced, permitting freedom in design, and maintaining a large Q value and range of variation.

DETAILED DESCRIPTION OF THE PREFERRED EMBODIMENTS

First Embodiment

Figure 1:
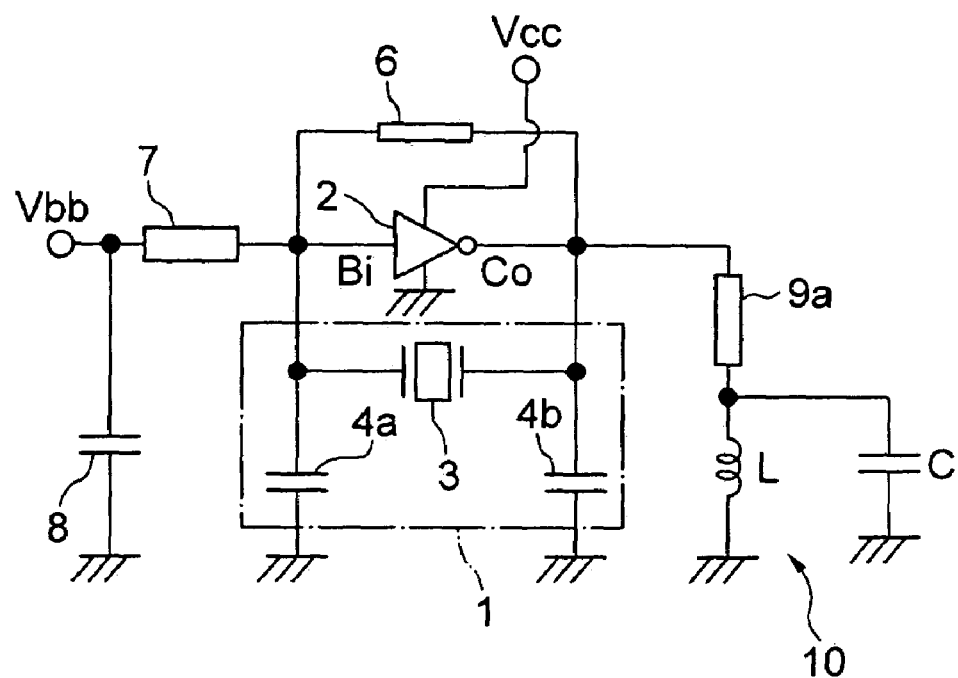
FIG. 1 is a simplified drawing explaining a first embodiment of a crystal oscillator circuit of the present invention.

FIG. 1 is a drawing explaining one embodiment of the present invention, and represents a simple crystal oscillator circuit employing an ECL (Emitter Coupling Logic) as an oscillation amplifier.

The crystal oscillator circuit of the present invention comprises, as shown in FIG. 1: a resonance circuit 1 comprising a crystal element 3 as the inductor component and input and output dividing capacitors 4a and 4b, an oscillation amplifier 2 comprising an ECL driven by a power supply voltage Vcc connected to the resonance circuit 1, a feedback resistor 6, a pull-down resistor 9a provided between an output terminal $C_o$ of the oscillation amplifier (ECL) 2 and ground through an inductor L and a capacitor C, and a high-frequency blocking resistor 7 and a bypass capacitor 8 to which is applied a power supply Vbb, between an input terminal $B_i$ of the ECL and ground.

In a first embodiment, a pull-down resistor 9a is connected in series with an AC impedance amplifier circuit to give a grounding configuration. The AC impedance amplifier circuit here is a parallel resonance circuit 10 comprising an inductor L and a capacitor C. The resonance frequency of the parallel resonance circuit 10 is the same as the oscillation frequency.

According to the first embodiment, the impedance of the parallel resonance circuit 10 connected in series to the pull-down resistor 9a as shown in FIG. 1 is infinite at the oscillation frequency. Therefore the impedance of the series circuit of the pull-down resistor 9a and the parallel resonance circuit 10 is also infinite. As a result, the equivalent series capacitance of the dividing capacitor 4b is, in practice, the value of the capacitance of the dividing capacitor 4b itself. Therefore the resonance circuit 1 can be designed independently without consideration of the pull-down resistor 9a. Furthermore, changes in the oscillation frequency and oscillation gain can be prevented by providing the pull-down resistor 9a.

Moreover, in the first embodiment, the equivalent series resistance of the pull-down resistor 9a as shown in FIG. 1 is zero, a high Q value can be maintained, and for example, phase noise characteristics are improved. Furthermore, since the equivalent series capacitance is, in practice, the value of the capacitance of the dividing capacitor 4b itself, when the output dividing capacitor 4b is a variable voltage device constituting a voltage-controlled oscillator, a large range of variation of the oscillation frequency can be maintained.

Figure 2:
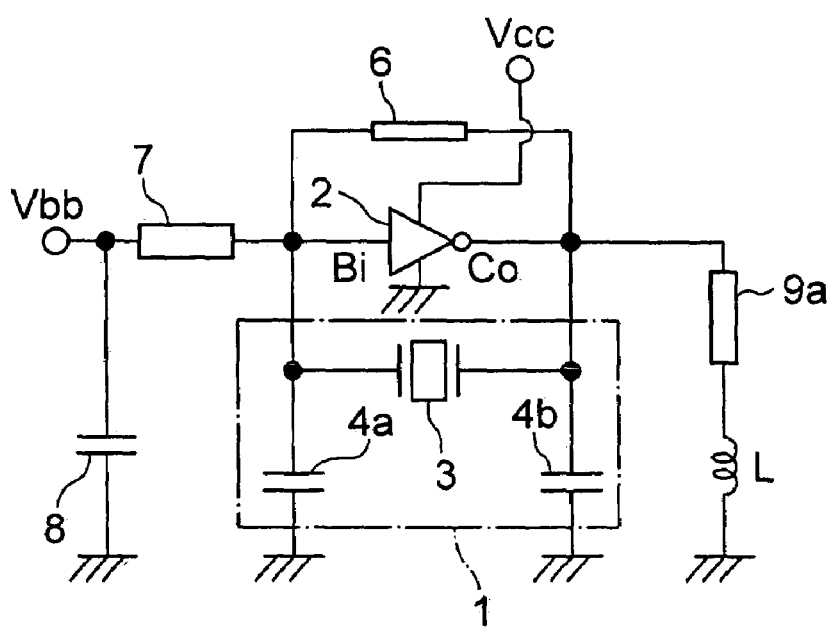
FIG. 2 is a simplified drawing of the crystal oscillator circuit explaining another example of the first embodiment of the present invention.

As the AC impedance amplifier circuit, instead of the parallel resonance circuit 10 as shown in FIG. 2, the inductor L may be used alone as shown in FIG. 2. In this case, since the AC impedance is increased by the inductor L as the frequency increases, the effect on the dividing capacitor 4b on the output side is reduced, and the same result is obtained. Moreover, since the DC impedance is small, this effect can be ignored without restricting the current in the pull-down resistor.

Second Embodiment

Figure 3:
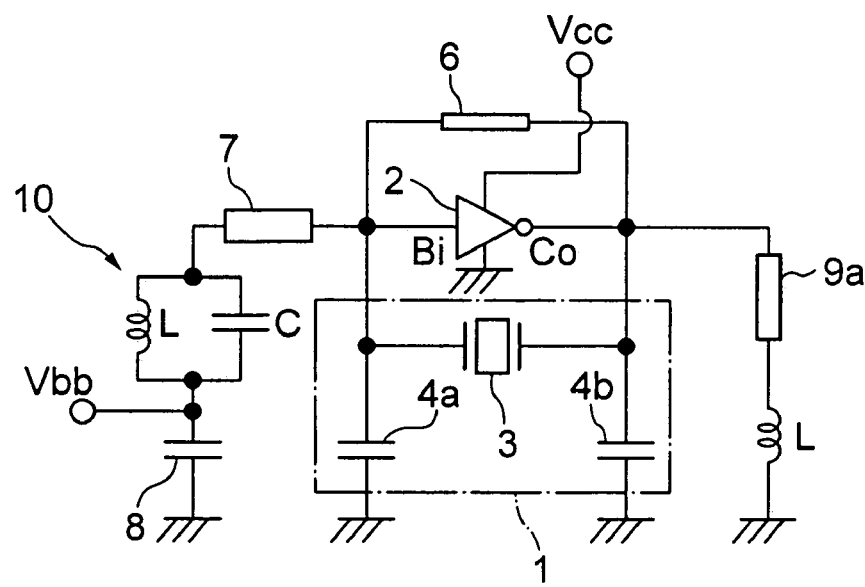
FIG. 3 is a simplified drawing of an oscillator circuit explaining a second embodiment of the present invention.

FIG. 3 is a simple crystal oscillator circuit employing ECL as an oscillation amplifier, explaining a second embodiment of the present invention.

In the first embodiment of the present invention (see FIG. 1), the AC impedance amplifier circuit is connected in series to the pull-down resistor 9a on the output side and connected to ground. However in the second embodiment, an AC impedance amplifier circuit is also provided for the high-frequency blocking resistor 7 on the input side as shown in FIG. 3. In the AC impedance amplifier circuit here, the parallel resonance circuit 10 is connected to the high-frequency blocking resistor 7. As a result, the equivalent series capacitance of the dividing capacitor 4a on the input side is, in practice, the value of the capacitance of the dividing capacitor 4a itself.

Therefore in the second embodiment of the present invention, the resonance circuit 1 comprising the crystal element 3 and the dividing capacitors 4a and 4b can be designed independently without consideration of the pull-down resistor 9a or the high-frequency blocking resistor 7. Furthermore, more so than with the first embodiment of the present invention, change in the oscillation frequency and oscillation gain can be prevented, the Q value maintained at a high value, and for example, phase noise characteristics are improved. Moreover even when the dividing capacitor 4a on the input side is a variable voltage capacitative element giving a voltage-controlled type, a large range of variation of the oscillation frequency can be maintained.

Figure 4:
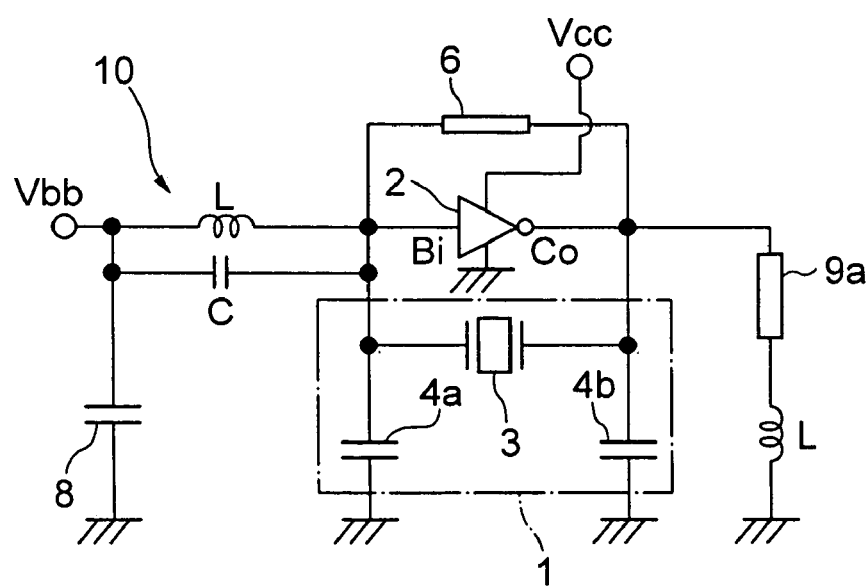
FIG. 4 is a simplified drawing of an oscillator circuit explaining another example of the second embodiment of the present invention.
Figure 5:
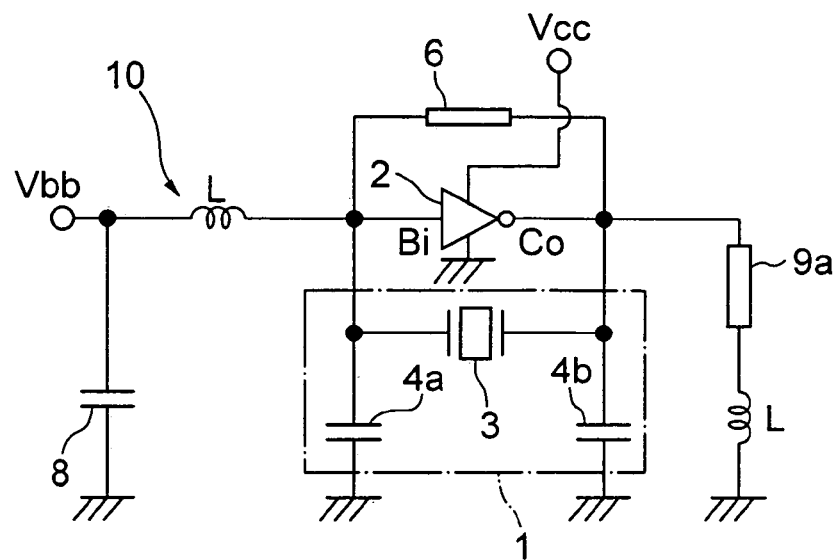
FIG. 5 is a simplified drawing of an oscillator circuit explaining another example of the second embodiment of the present invention.
Figure 6:
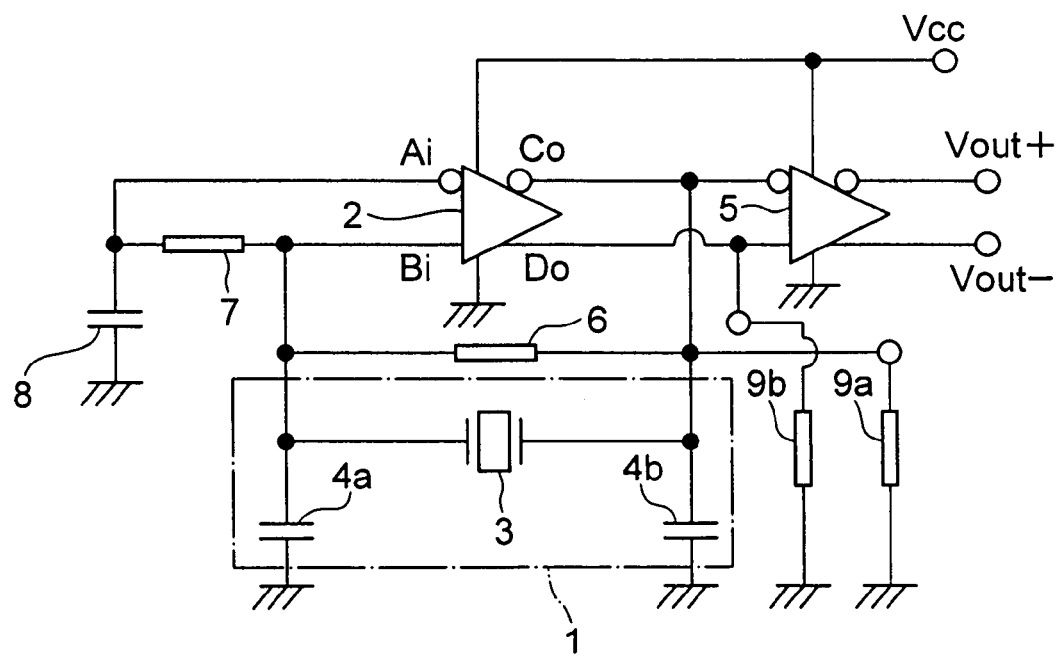
FIG. 6 is a drawing explaining an example of a conventional crystal oscillator circuit.
Figure 7:
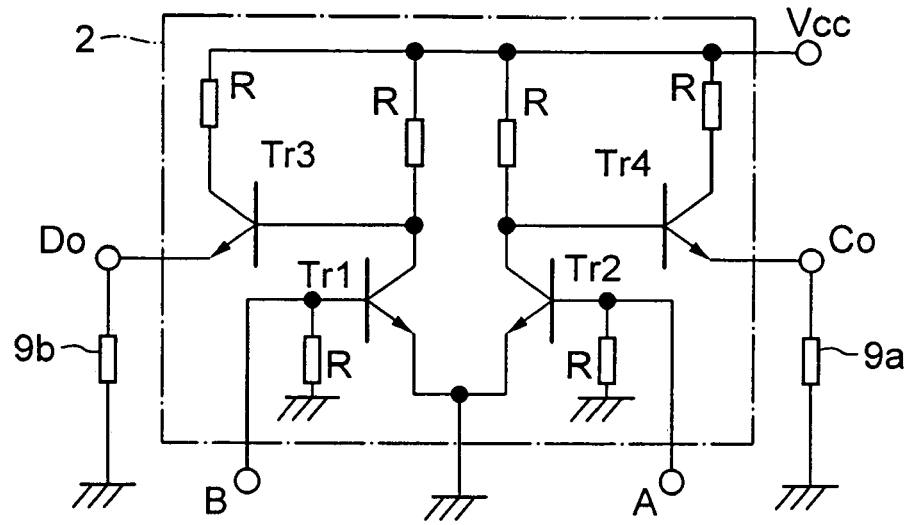
FIG. 7 is a drawing explaining an internal circuit of an example of a conventional ECL.
Figure 8:
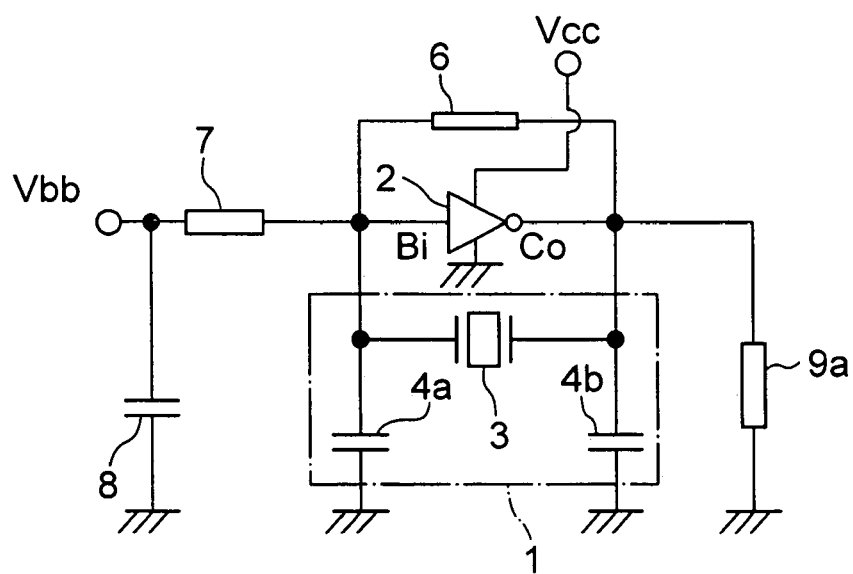
FIG. 8 is a simplified drawing of an oscillator circuit explaining a conventional example.

In the second embodiment, in the case where the impedance of the parallel resonance circuit 10 serving as the AC impedance amplifier circuit shown in FIG. 3 is sufficiently high, then as shown in FIG. 4, the high-frequency blocking resistor 7 may be omitted. Moreover as shown in FIG. 5, the capacitor C may be omitted leaving only the inductance L which increases the impedance in proportion to the frequency.

What is claimed is:

1. A crystal oscillator circuit comprising: a resonance circuit consisting of a crystal element as an inductor component and a dividing capacitor, an oscillation amplifier comprising an ECL driven by a power supply voltage connected to said resonance circuit, and a high-frequency blocking resistor between an input terminal of said ECL and ground, wherein there is provided an AC impedance amplifier circuit connected in series to said high-frequency blocking resistor.

2. A crystal oscillator circuit according to claim 1, wherein said AC impedance amplifier circuit is a parallel resonance circuit connected in series to said high-frequency blocking resistor, and a resonant frequency of said resonance circuit is the same frequency as the oscillation frequency.

3. A crystal oscillator circuit according to claim 1, wherein in said the AC impedance amplifier circuit, said high-frequency blocking resistor is replaced by a parallel resonance circuit, and a resonant frequency of said parallel resonance circuit is the same frequency as the oscillation frequency.

4. A crystal oscillator circuit according to claim 1, wherein in said AC impedance amplifier circuit, said high-frequency blocking resistor is replaced by an inductor.

5. A crystal oscillator circuit comprising: a resonance circuit consisting of a crystal element as an inductor component and a dividing capacitor, an oscillation amplifier comprising an ECL driven by a power supply voltage connected to said resonance circuit, a pull-down resistor between an input terminal of said ECL and ground, and a high-frequency blocking resistor between an input terminal of said ECL and ground, wherein there is provided an AC impedance amplifier circuit connected in series to said pull-down resistor, and there is provided an AC impedance amplifier circuit connected in series to said high-frequency blocking resistor.

* * * * *